(12) United States Patent
Lee et al.

(10) Patent No.: US 9,559,677 B2
(45) Date of Patent: Jan. 31, 2017

(54) STACKED SEMICONDUCTOR APPARATUS BEING ELECTRICALLY CONNECTED THROUGH THROUGH-VIA AND MONITORING METHOD

(71) Applicant: SK hynix Inc., Icheon-si, Gyeonggi-do (KR)

(72) Inventors: Sang Ho Lee, Icheon-si (KR); Ki Chang Kwean, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 58 days.

(21) Appl. No.: 14/488,418

(22) Filed: Sep. 17, 2014

(65) Prior Publication Data

US 2015/0358010 A1 Dec. 10, 2015

(30) Foreign Application Priority Data

Jun. 9, 2014 (KR) .................. 10-2014-0069442

(51) Int. Cl.
*H01L 21/00* (2006.01)
*H03K 5/159* (2006.01)
*H01L 25/065* (2006.01)
*G01R 31/26* (2014.01)

(52) U.S. Cl.
CPC .......... *H03K 5/159* (2013.01); *G01R 31/2601* (2013.01); *H01L 25/0657* (2013.01); *H01L 2224/16145* (2013.01); *H01L 2224/16225* (2013.01); *H01L 2225/06541* (2013.01)

(58) Field of Classification Search
CPC .. G01R 31/2601; H01L 25/0657; H03K 5/159
See application file for complete search history.

(56) References Cited

U.S. PATENT DOCUMENTS

| 2008/0204091 A1* | 8/2008 | Choo | ............... G11C 5/02 327/149 |
| 2010/0182046 A1* | 7/2010 | Otsuga | ............... G06F 1/12 326/93 |
| 2013/0076387 A1 | 3/2013 | Ishikawa et al. | |

FOREIGN PATENT DOCUMENTS

KR 1020110002281 A 1/2011

\* cited by examiner

*Primary Examiner* — Whitney T Moore
*Assistant Examiner* — Joseph Galvin, III
(74) *Attorney, Agent, or Firm* — William Park & Associates Ltd.

(57) ABSTRACT

A semiconductor apparatus includes a plurality of stacked chips. Each of the plurality of stacked chips includes a delay chain. Each of the plurality of stacked chips comprises a plurality of Through-Vias, wherein one of the plurality of Through-Vias formed in a first one of the plurality of stacked chips and electrically coupled to a predetermined location of a first delay chain on the first one of the plurality of stacked chips and one of the plurality of Through-Vias formed in a neighboring one of the plurality of stacked chips and electrically coupled to a predetermined location of a delay chain on the neighboring one of the plurality of stacked chips are configured to electrically couple the first one of the plurality of stacked chips to the neighboring one of the plurality of stacked chips. A signal transmitted from a first one of the plurality of stacked chips generates a feedback signal to the first one of the plurality of stacked chips through one or more of the plurality of Through-Vias.

10 Claims, 5 Drawing Sheets

STACKED SEMICONDUCTOR APPARATUS BEING ELECTRICALLY CONNECTED THROUGH THROUGH-VIA AND MONITORING METHOD

CROSS-REFERENCES TO RELATED APPLICATION

The present application claims priority under 35 U.S.C. §119(a) to Korean application number 10-2014-0069442, filed on Jun. 9, 2014, in the Korean Intellectual Property Office, which is incorporated herein by reference in its entirety as set forth in full.

BACKGROUND

1. Technical Field

Various embodiments relate to a semiconductor apparatus, and more particularly, to a semiconductor apparatus that is stacked through a Through-Via.

2. Related Art

Recent technological advances directed towards attempts to increase the integrity of semiconductor apparatuses have led to the development of a 3 dimensional (3D) semiconductor apparatus where a plurality of chips are stacked and packaged in single package. The 3D semiconductor apparatus seeks to increase integrity in a relatively limited amount of space by vertically stacking two or more chips.

In one example of a 3D semiconductor apparatus, a plurality of substantially similar or different chips are stacked. The plurality of stacked chips are electrically coupled to each other through wires like metal lines.

In some cases, "Through Silicon Via" (TSV) is used to electrically couple the plurality of stacked chips. The TSV extends through the plurality of stacked chips. A semiconductor apparatus that uses a TSV structure that vertically extends through and electrically couples the plurality of chips typically has a relatively smaller size package than a semiconductor apparatus that uses a wire structure to electrically couple the plurality of chips through edge-wiring.

A Through Via such as the TSV is typically created by forming a hole that extends through the chip, forming a dielectric layer on the side wall of the hole, and filling a conducting material in the dielectric layer. The Through-Via is used as a pathway for transferring a signal and electrically couples the stacked chips.

SUMMARY

In an embodiment, a semiconductor apparatus may include a plurality of stacked chips, wherein each of the plurality of stacked chips comprises a delay chain and a plurality of Through-Vias, wherein each of the plurality of stacked chips comprises a plurality of Through-Vias, wherein one of the plurality of Through-Vias formed in a first one of the plurality of stacked chips and electrically coupled to a predetermined location of a first delay chain on the first one of the plurality of stacked chips and one of the plurality of Through-Vias formed in a neighboring one of the plurality of stacked chips and electrically coupled to a predetermined location of a delay chain on the neighboring one of the plurality of stacked chips are configured to electrically couple the first one of the plurality of stacked chips to the neighboring one of the plurality of stacked chips, and wherein a signal transmitted from a first one of the plurality of stacked chips generates a feedback signal to the first one of the plurality of stacked chips through one or more of the plurality of Through-Vias.

In an embodiment, a semiconductor apparatus may include an oscillating control portion disposed in a first chip, and configured to generate a transmission signal in response to receiving an input signal and a feedback signal, first and second Through-Vias configured to electrically couple the first chip and a second chip, a first delay portion disposed in the first chip and electrically coupled to the first and second Through-Vias, and a second delay portion disposed in the second chip and electrically coupled to the first and second Through-Vias, wherein the oscillating control portion transmits the transmission signal to the first Through-Via.

In an embodiment, a monitoring method of a semiconductor apparatus including a plurality of chips, wherein each of the plurality of chips has a plurality of Through-Vias, and is electrically coupled to another one of the plurality chips, the monitoring method may include defining a chip of the plurality of chips as a reference chip for a oscillating path, selecting a oscillating path passing through at least two of the plurality of Through-Vias disposed in at least two of the plurality of chips, and monitoring characteristics of the at least of the plurality of Through-Vias based on a signal transmitted through the oscillating path.

DETAILED DESCRIPTION

Various embodiments of a semiconductor apparatus will be described below with reference to the accompanying drawings.

Figure 1:
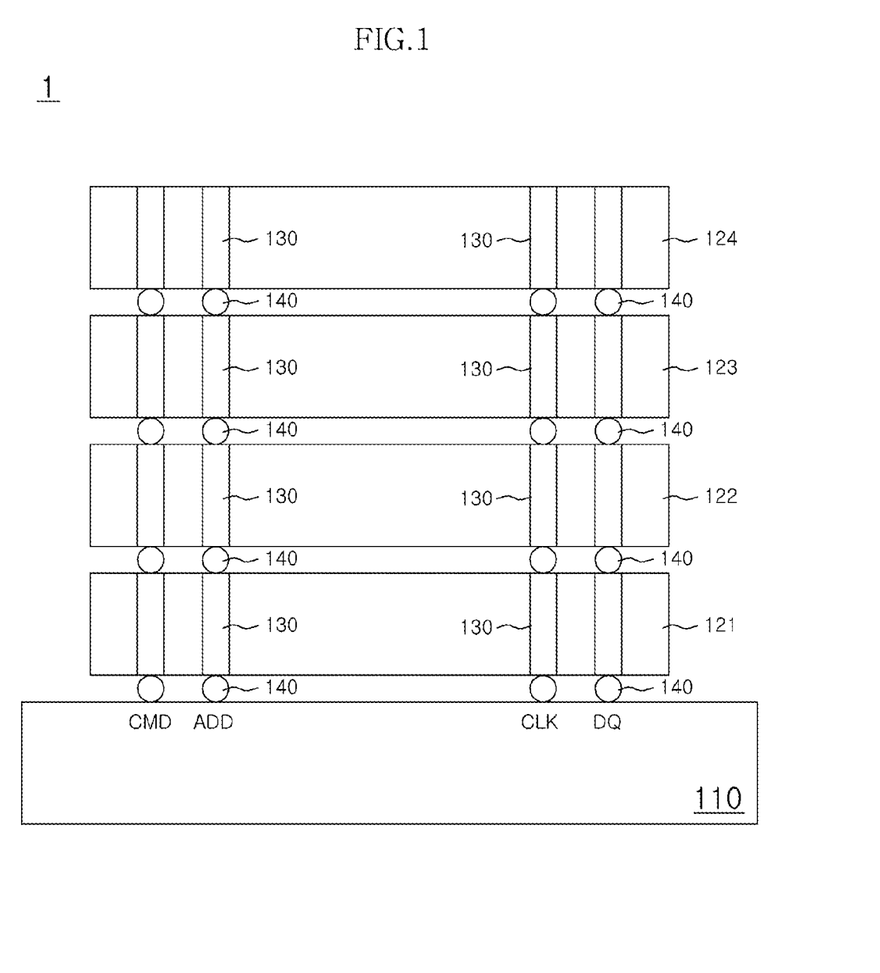
FIG. 1 is a schematic diagram representation of an embodiment of a semiconductor apparatus.

Referring to FIG. 1, an embodiment of a semiconductor apparatus 1 is configured to include a base chip 110 and a plurality of stacked chips 121-124. Each of the plurality of stacked chips 121-124 is configured to include a number of Through-Vias 130 formed therein. The Through-Vias 130 of the plurality of stacked chips 121-124 are configured to be electrically coupled to each other through bumps 140. The plurality of stacked chips 121-124 are configured to be electrically coupled to each other through the Through-Vias 130 and the bumps 140. While FIG. 1 shows four stacked chips 121-124, the semiconductor apparatus 1 may include a fewer or a greater number of stacked chips. In an embodiment, each of the plurality of stacked chips 121-124 may be substantially similar to one another. In an embodiment, one or more of the plurality of stacked chips 121-124 may be different from the rest of the plurality of stacked chips 121-124.

The plurality of stacked chips 121-124 is configured to be stacked over the base chip 110. The base chip 110 may be an interposer substrate, a logic chip, or a controller chip. The plurality of stacked chips 121-124 may be packaged into single package, and as a single semiconductor apparatus. The base chip 110 is configured to be electrically coupled to an external host apparatus or to an external controller, and is configured to transfer signals between the plurality of stacked chips 121-124, and the external host apparatus or the external controller. The base chip 110 is configured to include a plurality of signal paths (not illustrated) therein to transfer a control signal to control of the operation of the plurality of stacked chips 121-124. The plurality of stacked chips 121-124 may be sequentially stacked over the base chip 110 through the bumps 140.

The base chip 110 is configured to output a control signal, such as for example, a command signal CMD, an address signal ADD, a clock signal CLK, a data signal DQ, and so forth, associated with the operation of the plurality of stacked chips 121-124. The command signal CMD, the address signal ADD, the clock signal CLK, and the data signal DQ may be transmitted to the plurality of stacked chips 121-124 through the Through-Vias 130 associated with each of the plurality of stacked chips 121-124. The plurality of stacked chips 121-124 are configured to perform an operation in response to a control signal received through the Through-Vias 130.

Figure 2:
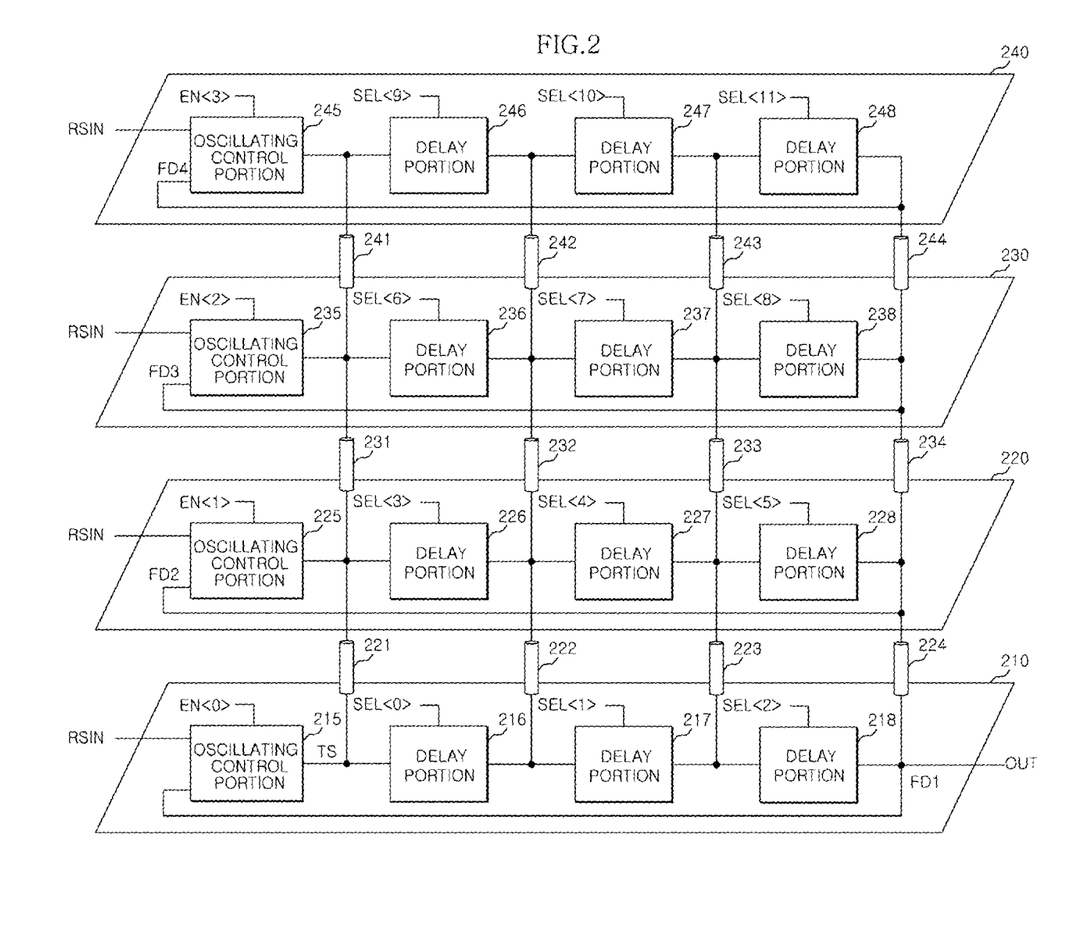
FIG. 2 is a schematic block diagram representation of an embodiment of a semiconductor apparatus.

FIG. 2 is a schematic block diagram representation of an embodiment of a semiconductor apparatus 2. The semiconductor apparatus 2 is configured to include first, second, third and fourth chips 210, 220, 230, 240. While FIG. 2 shows four chips 210, 220, 230, 240, alternative embodiments may include a fewer or greater number of chips. In an embodiment, the first, second, third and fourth chips 210, 220, 230, 240 may be used as the plurality of stacked chips 121-124 described with reference to FIG. 1. In an embodiment, the first chip 210 may be the base chip 110 described above with reference to FIG. 1, and the second, third and fourth chips 220, 230, 240 may correspond to the plurality of stacked chips 121-124 described with reference to FIG. 1. Each of the first, second, third and fourth chips 210, 220, 230, 240 is configured to include a plurality of Through-Vias for electrical coupling the chip to neighbouring chips. The second chip 220 is configured to include first, second, third and fourth Through-Vias 221-224, the third chip 230 is configured to include fifth, sixth, seventh and eighth Through-Vias 231-234, and the fourth chip 240 is configured to include ninth, tenth, eleventh, and twelfth Through-Vias 241-244. FIG. 2 does not show the Through-Vias included in the first chip 210. The first, fifth, and ninth Through Vias 221, 231, 241 are configured to be substantially vertically aligned, and configured to be electrically coupled to each other. The second, sixth, and tenth Through Vias 222, 232, 242 are configured to be substantially vertically aligned, and configured to be electrically coupled to each other. The third, seventh, and eleventh Through Vias 223, 233, 243 are configured to be substantially vertically aligned, and configured to be electrically coupled to each other. The fourth, eighth, and twelfth Through Vias 224, 234, 244 are configured to be substantially vertically aligned, and configured to be electrically coupled to each other.

Each of the first, second, third and fourth chips 210, 220, 230, 240 is configured to include a ring oscillator. The ring oscillator is configured to include an oscillating control portion 215, 225, 235, 245, and a delay chain. The delay chain is configured to include a plurality of delay portions 216, 217, 218, 226, 227, 228, 236, 237, 238, 246, 247, 248. The first chip 210 is configured to include the first oscillating control portion 215, and the first, second and third delay portions 216, 217, 218. The first oscillating control portion 215 is configured to receive an input signal RSIN, and a first feedback signal FD1, and is configured to be electrically coupled to the first Through-Via 221. The first oscillating control portion 215 is configured to generate a transmission signal TS based on the input signal RSIN, and the first feedback signal FD1, and is configured to transmit the transmission signal TS to the first Through-Via 221. The first delay portion 216 is configured to be electrically coupled to the first oscillating control portion 215, the first Through-Via 221, and the second Through-Via 222. The second delay portion 217 is configured to be electrically coupled to the first delay portion 216, the second Through-Via 222, and the third Through-Via 223. The third delay portion 218 is configured to be electrically coupled to the second delay portion 217, the third Through-Via 223, and the fourth Through-Via 224. The first oscillating control portion 215 is configured to be electrically coupled to the fourth Through-Via 224, and is configured to receive the first feedback signal FD1 through the fourth Through-Via 224.

The second chip 220 is configured to include the second oscillating control portion 225, and the fourth, fifth and sixth delay portions 226, 227, 228. The second oscillating control portion 225 is configured to receive the input signal RSIN, and a second feedback signal FD2, and is configured to be electrically coupled to the first Through-Via 221 and the fifth Through-Via 231. The fourth delay portion 226 is configured to be electrically coupled to the second oscillating control portion 225, the first Through-Via 221, the second Through-Via 222, the fifth Through-Via 231, and the sixth Through-Via 232. The fifth delay portion 227 is configured to be electrically coupled to the fourth delay portion 226, the second Through-Via 222, the third Through-Via 223, the sixth Through-Via 232, and the seventh Through-Via 233. The sixth delay portion 228 is configured to be electrically coupled to the fifth delay portion 227, the third Through-Via 223, the fourth Through-Via 224, the seventh Through-Via 233, and the eighth Through-Via 234.

The third chip 230 is configured to include the third oscillating control portion 235, and the seventh, eighth, and ninth delay portions 236, 237, 238. The third oscillating control portion 235 is configured to receive the input signal RSIN, and a third feedback signal FD3, and is configured to be electrically coupled to the fifth Through-Via 231 and the ninth Through-Via 241. The seventh delay portion 236 is configured to be electrically coupled to the third oscillating control portion 235, the fifth Through-Via 231, the sixth Through-Via 232, the ninth Through-Via 241, and the tenth Through-Via 242. The eighth delay portion 237 is configured to be electrically coupled to the seventh delay portion 236, the sixth Through-Via 232, the seventh Through-Via 233, the tenth Through-Via 242, and the eleventh Through-Via 243. The ninth delay portion 238 is configured to be electrically coupled to the eighth delay portion 237, the seventh Through-Via 233, the eighth Through-Via 234, the eleventh Through-Via 243, and the twelfth Through-Via 244.

The fourth chip 240 is configured to include the fourth oscillating control portion 245, and tenth, eleventh and twelfth delay portions 246, 247, 248. The fourth oscillating control portion 245 is configured to receive the input signal RSIN, and a fourth feedback signal FD4, and is configured to be electrically coupled to the ninth Through-Via 241. The tenth delay portion 246 is configured to be electrically coupled to the fourth oscillating control portion 245, the ninth Through-Via 241, and the tenth Through-Via 242. The eleventh delay portion 247 is configured to be electrically coupled to the tenth Through-Via 242, and the eleventh Through-Via 243. The twelfth delay portion 248 is configured to be electrically coupled to the eleventh Through-Via 243, and the twelfth Through-Via 244.

The first, second, third and fourth oscillating control portions 215, 225, 235, 245 are configured to be enabled in response to first, second, third and fourth enablement signals EN<0:3>, respectively. The first, second, third and fourth enablement signals EN<0:3> may be generated based on stacked chip information. Each of the first through twelfth delay portions 216, 217, 218, 226, 227, 228, 236, 237, 238, 246, 247, 248 are configured to be turned ON in response to an associated one of the first through twelfth selection signals SEL<0:11>. The first through twelfth selection signals SEL<0:11> may be generated based on the stacked chip information and path selection information. The semiconductor apparatus 2 is configured to select an oscillating path passing through one or more of the first to twelfth Through-Vias 221, 222, 223, 224, 231, 232, 233, 234, 241, 242, 243, 44 by enabling one of the first, second or third fourth enablement signals EN<0:3>, and by enabling one or more of the first through twelfth selection signals SEL<0:11>.

Figure 3:
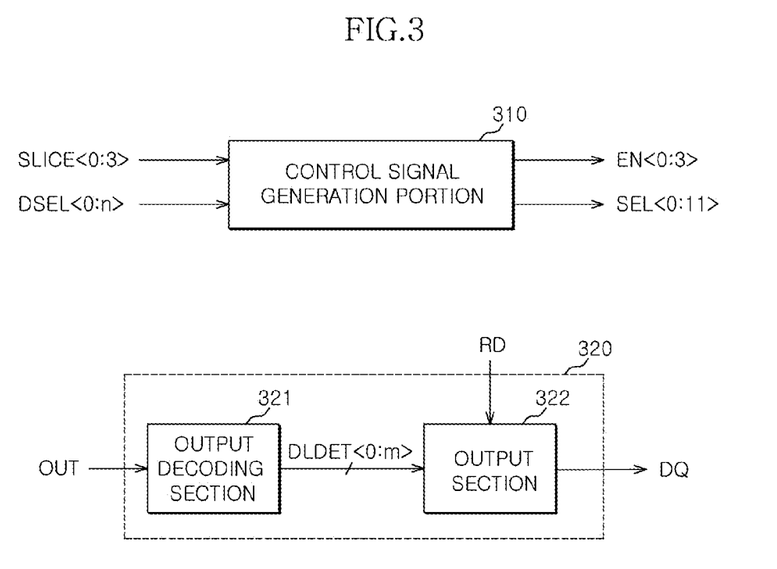
FIG. 3 is a block diagram representation of a control signal generation portion and an output monitoring portion of an embodiment of a semiconductor apparatus.

FIG. 3 is a block diagram representation of a control signal generation portion 310 and an output monitoring portion 320 of an embodiment of the semiconductor apparatus 2. The semiconductor apparatus 2 is configured to include the control signal generation portion 310, and the output monitoring portion 320. The control signal generation portion 310 is configured to generate the first, second, third and fourth enablement signals EN<0:3>, and the first through twelfth selection signals SEL<0:11> in response to stacked chip information SLICE<0:3>, and path selection information DSEL<0:n> (where n is a natural number). The stacked chip information SLICE<0:3> may be a 4-bit signal, where each bit corresponds an associated one of the four chips of the semiconductor apparatus 2. While the use of four chips and a 4 bit stacked chip information signal has been described, alternative embodiments may include a greater or fewer number of chips and/or bits in the stacked chip information signal. The control signal generation portion 310 is configured to include a decoding section for decoding the stacked chip information SLICE<0:3>, and the path selection information DSEL<0:n>. The control signal generation portion 310 may selectively enable and/or disable the first through twelfth selection signals SEL<0:11> based on the stacked chip information SLICE<0:3>, and the path selection information DSEL<0:n>.

The output monitoring portion 320 is configured to include an output decoding section 321, and an output section 322. The output decoding section 321 is configured to receive an output signal OUT, such as for example the first feedback signal FD1 through the fourth Through-Via 224, and is configured to generate a delay detection signal DLDET<0:m> (where m is a natural number). For example, the output decoding section 321 is configured to include a counting circuit configured to count a number of toggles of the first feedback signal FD1, and is configured to generate the delay detection signal DLDET<0:m> by decoding the counting result.

The output section 322 is configured to receive the delay detection signal DLDET<0:m>, and is configured to output the delay detection signal DLDET<0:nn> as data DQ in response to a read command RD. The output section 322 is configured to use a path that the semiconductor apparatus 2 uses to output normal data. The semiconductor apparatus 2 does not include an additional circuit for outputting the delay detection signal DLDET<0:m>. The output decoding section 321 is configured to load the delay detection signal DLDET<0:m> on a data transmission line, and the output section 322 is configured to transmit the loaded delay detection signal DLDET<0:m> as data DQ in response to the read command RD. The delay detection signal DLDET<0:m> may be transmitted to an external device through a data pad included in the semiconductor apparatus 2, and may be monitored by an external apparatus electrically coupled to the semiconductor apparatus 2.

The output monitoring portion 320 is configured to detect the delay amount or the electrical characteristic of one or more of the first through twelfth delay portions 216, 217, 218, 226, 227, 228, 236, 237, 238, 246, 247, 248, and one or more of the first through twelfth Through-Vias 221, 222, 223, 224, 231, 232, 233, 234, 241, 242, 243, 244 by receiving a signal passing through the oscillating path electrically formed in the semiconductor apparatus 2.

The control signal generation portion 310, and the output monitoring portion 320 may be included in one of the first, second, third and fourth chips 210, 220, 230, 240. In an embodiment, the control signal generation portion 310, and the output monitoring portion 320 may be included in the first chip 210. The control signal generation portion 310, and the output monitoring portion 320 are configured to be included in each of the first, second, third and fourth chips 210, 220, 230, 240, and are configured to be disposed in the interposer substrate, the logic chip, the controller chip, the external host apparatus, or the external controller.

Figure 4:
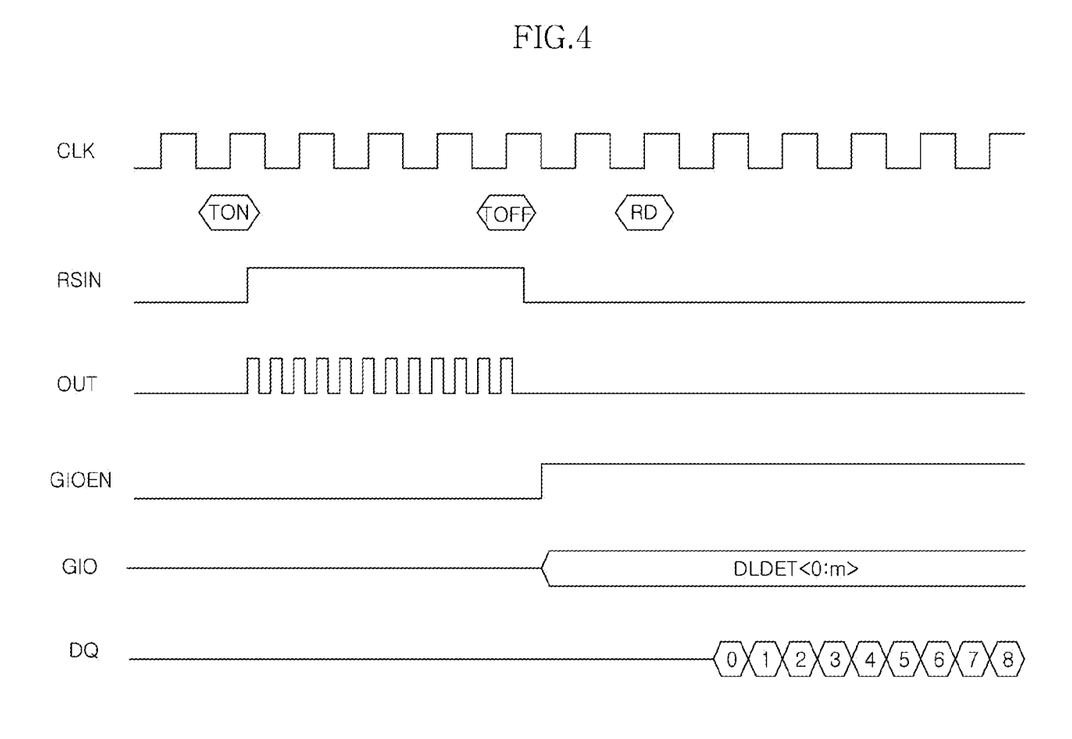
FIG. 4 is a timing diagram illustrating an operation of an embodiment of a semiconductor apparatus.

FIG. 4 is a timing diagram illustrating an operation of an embodiment of a semiconductor apparatus 2. An enablement command TON may be received at the semiconductor apparatus 2 to enable the monitoring of the characteristics of the Through-Vias in the semiconductor apparatus 2. When the enablement command TON is received at the semiconductor apparatus 2, the input signal RSIN may be enabled. Hereinafter, a case is described where the first enablement signal EN<0>, the second selection signal SEL<1>, the tenth selection signal SEL<9>, and the twelfth selection signal SEL<11> are enabled according to the stacked chip information SLICE<0:3> and the path selection information DSEL<0:n>. In this case, an oscillating path may be formed through all of the Through-Vias 221, 222, 223, 224, 231, 232, 233, 234, 241, 242, 243, 244 electrically coupling the first, second, third and fourth chips 210, 220, 230, 240.

When the input signal RSIN is enabled, an output signal OUT may be generated that oscillates with a period corresponding to the time it takes for a signal to be transmitted through all of the Through-Vias 221, 222, 223, 224, 231, 232, 233, 234, 241, 242, 243, 244 and the three numbers associated with the delay portions 217, 246, 248 of the semiconductor apparatus 2. The number of toggles of the output signal OUT may be stored as the delay detection signal DLDET<0:m> by the output decoding section 321. And then, when a disablement command TOFF is received at the semiconductor apparatus 2, the input signal RSIN may be disabled, and the generation of the output signal OUT may cease. When the disablement command TOFF is received at the semiconductor apparatus 2, a transmission enablement signal GIOEN may be enabled, and the delay detection signal DLDET<0:nn> that is generated by the output decoding section 321, may be loaded on a data transmission line GIO. After that, when the read command RD received at the semiconductor apparatus 2, the delay detection signal DLDET<0:m> that is loaded on the data transmission line GIO, may be transmitted as data DQ to a device external to the semiconductor apparatus 2 after a time piece corresponding to a read latency.

Figure 5:
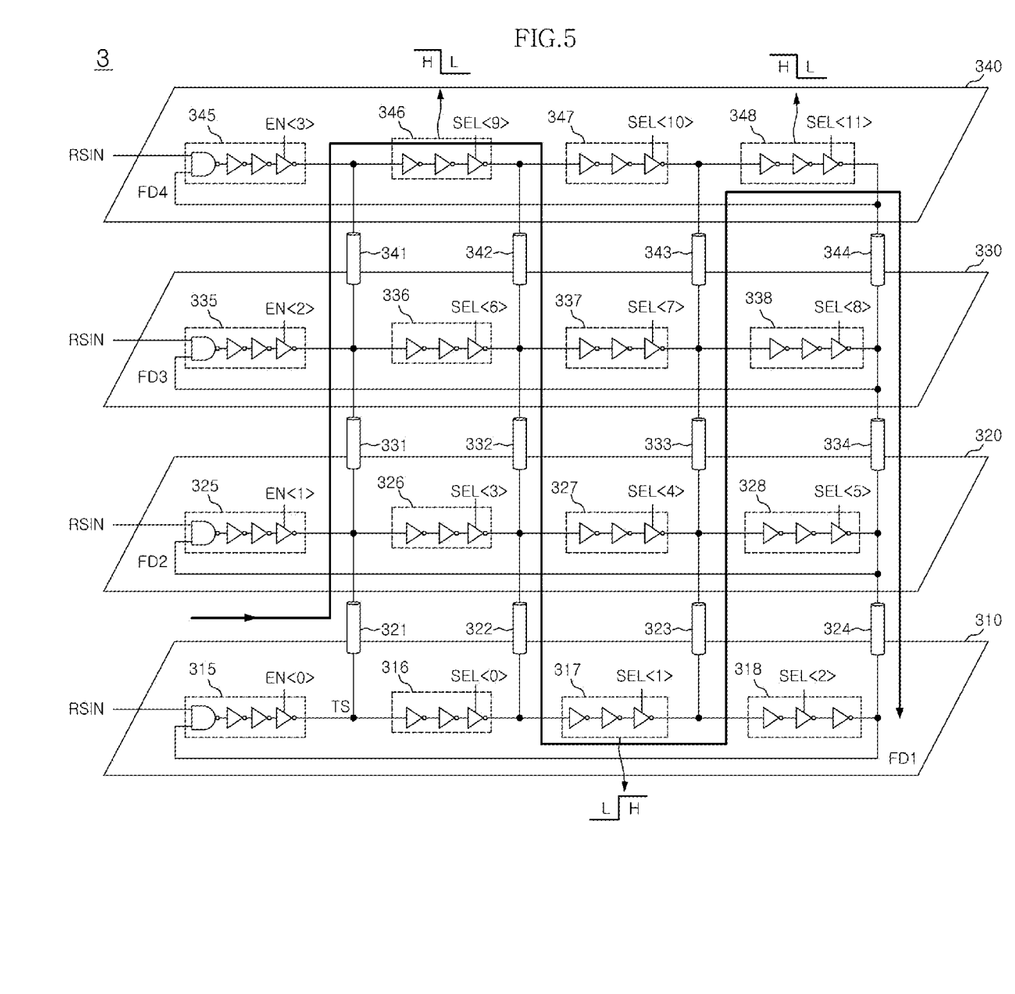
FIG. 5 is a schematic circuit diagram representation of an embodiment of a semiconductor apparatus.

FIG. 5 is a schematic circuit diagram representation of an embodiment of an embodiment of a semiconductor apparatus 3. The semiconductor apparatus 3 may monitor "Crosstalk" characteristics between neighboring Through-Vias that are configured to electrically couple the plurality of chips. The semiconductor apparatus 3 may be substantially similar to the semiconductor apparatus 2 described with reference to FIG. 4, and is configured to include first, second, third and fourth oscillating control portions 315, 325, 335, 45, and first through twelfth delay portions 316, 317, 318, 326, 327, 328, 336, 337, 338, 346, 347, 348. The first oscillating control portion 315 is configured to include a NAND gate, and an inverter chain. The inverter chain is turned ON in response to the first enablement signal EN<0>. The NAND gate is configured to receive the input signal RSIN, and the first feedback signal FD1. The inverter chain is configured to receive an output of the NAND gate, and to output the transmission signal TS. Substantially similar to the first oscillating control portion 315, each of the second, third and fourth oscillating control portions 325, 335, 345 is configured to include a NAND gate, and an inverter chain. The inverter chains of the second, third and fourth oscillating control portions 325, 335, 345 are configured to be turned ON in response to a corresponding one of the second, third and fourth enable signals EN<1:3>. The first delay portion 316 is configured to include an inverter chain that is turned ON in response to the first selection signal SEL<0>. Each of the second and third delay portions 317, 318 is configured to include an inverter chain that is turned ON in response to a corresponding one of the second and third selection signals SEL<1:2>. Each of the fourth through twelfth delay portions 326, 327, 328, 336, 337, 338, 346, 347, 348 is configured to include an inverter chain that is turned ON in response to a corresponding one of the fourth through twelfth selection signals SEL<3:11>.

The operation of the semiconductor apparatus 3 will be described with reference to FIG. 5. The control signal generation portion 310 that is described above with reference to FIG. 3 may be used to enable the first enable signal EN<0>, the second selection signal SEL<1>, the tenth selection signal SEL<9>, and the twelfth selection signal SEL<11> in response to the stacked chip information SLICE<0:3>, and the path selection information DSEL<0: n>. Therefore, the first oscillating control portion 315 may be enabled, the second delay portion 317, the tenth delay portion 346, and the twelfth delay portion 348 may be turned ON. The first oscillating control portion 315 may generate the transmission signal TS having a logic high level in response to the input signal RSIN having a logic high level, and the first feedback signal FD1 having a logic low level. The transmission signal TS may be received at the tenth delay portion 346 sequentially through the first Through-Via 321, the fifth Through-Via 331, and the ninth Through-Via 341 since the first delay portion 316, the fourth delay portion 326, and the seventh delay portion 336 are turned OFF. A signal transmitted by the tenth delay portion 346 may be received at the second delay portion 317 sequentially through the tenth Through-Via 342, the sixth Through-Via 332, and the second Through-Via 322 since the eleventh delay portion 347, the eighth delay portion 337, and the fifth delay portion 327 are turned OFF. A signal transmitted by the second delay portion 317 may be received at the twelfth delay portion 348 sequentially through the third Through-Via 323, the seventh Through-Via 333, and the eleventh Through-Via 343 since the third delay portion 318, the sixth delay portion 328, and the ninth delay portion 338 are turned OFF. A signal transmitted by the twelfth delay portion 348 may be transmitted sequentially through the twelfth Through-Via 344, the eighth Through-Via 334, and the fourth Through-Via 314. The signal transmitted through the fourth Through-Via 314 may be received as the first feedback signal FD1 at the NAND gate in the first oscillating control portion 315. As described above, the semiconductor apparatus 3 may select the oscillating path (illustrated with the bold line in FIG. 5) passing through all of the first through twelfth Through-Vias 321, 322, 323, 324, 331, 332, 333, 334, 341, 342, 343, 344. The first oscillating control portion 315 may generate the transmission signal TS having a logic low level in response to the first feedback signal FD1 having a logic high level. Therefore, the first feedback signal FD1 may be a oscillating signal with a period.

While the semiconductor apparatus 3 may, for example, select an oscillating path passing through all of the first through twelfth Through-Vias 321, 322, 323, 24, 331, 332, 333, 334, 341, 342, 343, 344 as described above, the semiconductor apparatus 3 may select different oscillating paths by selectively enabling the first, second, third and fourth oscillating control portions 315, 325, 335, 345, and individually turning ON or OFF the first through twelfth delay portions 316, 317, 318, 326, 327, 328, 336, 337, 338, 346, 347, 348. The semiconductor apparatus 3 may determine a reference chip from among the first, second, third and fourth chips 210, 220, 230, 240 by enabling one of the first, second, third and fourth enable signals EN<0:3> based on the stacked chip information SLICE<0:3>, and by enabling one of the first, second, third and fourth oscillating control portions 315, 325, 335, 345. The semiconductor apparatus 3 may select the oscillating path passing through two or more of the first through twelfth Through-Vias 321, 322, 323, 324, 331, 332, 333, 334, 341, 342, 343, 344 in two or more of the first, second, third and fourth chips 310, 320, 330, 340 by enabling two or more of the first through twelfth selection signals SEL<0:11> based on the stacked chip information SLICE<0:3>, and the path selection information DSEL<0: n>. The semiconductor apparatus 3 may monitor the characteristics of one of the first through twelfth Through-Vias 321, 322, 323, 324, 331, 332, 333, 334, 341, 342, 343, 44 by monitoring a signal transmitted through a oscillating path passing through the selected Through Via.

In an embodiment, each of the first through twelfth delay portions 316, 317, 318, 326, 327, 328, 336, 337, 338, 346, 347, 348 is configured to invert and output the received signals. As shown in FIG. 5, each of the first through twelfth delay portions 316, 317, 318, 326, 327, 328, 336, 337, 338, 346, 347, 348 may be an inverter chain including an odd numbers of inverters. The tenth delay portion 346 may invert a signal transmitted through the ninth Through-Via 341, and transmit the inverted signal to the tenth Through-Via 342. The second delay portion 317 may invert a signal transmitted through the second Through-Via 322, and transmit the inverted signal to the third Through-Via 323. The twelfth delay portion 348 may invert a signal transmitted through the eleventh Through-Via 343, and transmit the inverted signal to the twelfth Through-Via 344. Therefore, a signal transmitted sequentially through the first Through-Via 321, the fifth Through-Via 331, and the ninth Through-Via 341 may have a logic high level, and a signal transmitted sequentially through the tenth Through-Via 342, the sixth Through-Via 332, and the second Through-Via 322 may have a logic low level. Also, a signal transmitted sequentially through the third Through-Via 323, the seventh Through-Via 333, and the eleventh Through-Via 343 may have a logic high level, and a signal transmitted sequentially through the twelfth Through-Via 344, the eighth Through-Via 334, and the fourth Through-Via 324 may have a logic low level. As described above, the Through-Vias 321, 331, 341, 323, 333, 343 of first and third columns may transmit a signal having a logic high level, and the Through-Vias 322, 332, 342, 332, 324, 334, 344 of second and fourth columns may transmit a signal having a logic low level, and the "Cross-talk" effect between the Through-Vias of neighboring columns may be monitored. A "column" may refer to the plurality of Through-Vias that are substantially vertically aligned. The semiconductor apparatus 3 may monitor interference relationships between neighboring Through-Vias in a number of different ways by transmitting signals having opposite levels through the Through-Vias of each column. The semiconductor apparatus 3 may monitor the "Cross-talk" characteristics with reference to disposition distance of the Through-Vias by selecting a neighboring Through-Vias of various distances.

While certain embodiments have been described above, it will be understood to those skilled in the art that the embodiments described are by way of example only. Accordingly, the stacked semiconductor apparatus being connected through through-via and monitoring method should not be limited based on the described embodiments. Rather, the stacked semiconductor apparatus being connected through through-via and monitoring method described herein should only be limited in light of the claims that follow when taken in conjunction with the above description and accompanying drawings.

What is claimed is:

1. A semiconductor apparatus comprising:
a plurality of stacked chips, wherein each of the plurality of stacked chips comprises:
a delay chain; and
a plurality of Through-Vias,
wherein one of the plurality of Through-Vias formed in a first one of the plurality of stacked chips and electrically coupled to a predetermined location of a first delay chain on the first one of the plurality of stacked chips and one of the plurality of Through-Vias formed in a neighboring one of the plurality of stacked chips and electrically coupled to a predetermined location of a delay chain on the neighboring one of the plurality of stacked chips are configured to electrically couple the first one of the plurality of stacked chips to the neighboring one of the plurality of stacked chips, and
wherein a signal transmitted from the first one of the plurality of stacked chips generates a feedback signal to the first one of the plurality of stacked chips through one or more of the plurality of Through-Vias.

2. A semiconductor apparatus comprising:
an oscillating control portion disposed in a first chip, and configured to generate a transmission signal in response to receiving an input signal and a feedback signal;
first and second Through-Vias configured to electrically couple the first chip and a second chip;
a first delay portion disposed in the first chip and electrically coupled to the first and second Through-Vias; and
a second delay portion disposed in the second chip and electrically coupled to the first and second Through-Vias,
wherein the oscillating control portion transmits the transmission signal to the first Through-Via, and receives the feedback signal through the second Through-Via.

3. The semiconductor apparatus of claim 2, wherein the first and second delay portions are turned ON in response to first and second selection signals, respectively, wherein the first and second selection signals are generated based on stacked chip information and path selection information.

4. The semiconductor apparatus of claim 3, wherein the first delay portion is turned OFF in response to the first selection signal, and the second delay portion is turned ON in response to the second selection signal.

5. The semiconductor apparatus of claim 2, further comprising:
third and fourth Through-Vias configured to electrically couple the first chip and the second chip;
a third delay portion disposed in the first chip and electrically coupled to the second and third Through-Vias;
a fourth delay portion disposed in the second chip and electrically coupled to the second and third Through-Vias;
a fifth delay portion disposed in the first chip and electrically coupled to the third and fourth Through-Vias; and
a sixth delay portion disposed in the second chip, and electrically coupled to the third and fourth Through-Vias.

6. The semiconductor apparatus of claim 5, wherein the oscillating control portion receives the feedback signal from one of the second, third and fourth Through-Vias.

7. The semiconductor apparatus of claim 6, wherein the first, second, third, fourth, fifth and sixth delay portions are turned ON in response to first, second, third, fourth, fifth and sixth selection signals, respectively, wherein the first, second, third, fourth, fifth and sixth selection signals are generated based on stacked chip information and path selection information.

8. The semiconductor apparatus of claim 6, wherein the first delay portion is turned OFF in response to the first selection signal, the second delay portion is turned ON in response to the second selection signal, the third delay portion is turned ON in response to the third selection signal, the fourth delay portion is turned OFF in response to the fourth selection signal, the fifth delay portion is turned OFF in response to the fifth selection signal, and the sixth delay portion is turned ON in response to the sixth selection signal.

9. The semiconductor apparatus of claim 8, wherein the second delay portion inverts a signal received through the first Through-Via, and transmits the inverted signal to the second Through-Via.

10. The semiconductor apparatus of claim 9, wherein the third delay portion inverts a signal received through the second Through-Via, and transmits the inverted signal to the third Through-Via.

* * * * *